(12) United States Patent
Law et al.

(10) Patent No.: US 8,314,635 B2
(45) Date of Patent: Nov. 20, 2012

(54) METHODS FOR FORMING PROGRAMMABLE TRANSISTOR ARRAY COMPRISING BASIC TRANSISTOR UNITS

(75) Inventors: Oscar M. K. Law, Hsin-Chu (TW); Kuo H. Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 234 days.

(21) Appl. No.: 12/616,985

(22) Filed: Nov. 12, 2009

(65) Prior Publication Data

US 2010/0181600 A1    Jul. 22, 2010

Related U.S. Application Data

(60) Provisional application No. 61/146,564, filed on Jan. 22, 2009.

(51) Int. Cl.
*H01L 25/00* (2006.01)
*H01L 21/70* (2006.01)
(52) U.S. Cl. ............... 326/41; 326/38; 326/10; 257/499
(58) Field of Classification Search .................... 326/41, 326/38, 10; 257/499
See application file for complete search history.

(56) References Cited

U.S. PATENT DOCUMENTS

| | | | | |
|---|---|---|---|---|
| 5,539,235 | A  * | 7/1996 | Allee | 257/390 |
| 6,215,327 | B1 * | 4/2001 | Lyke  | 326/41  |
| 7,102,387 | B1 * | 9/2006 | Lyke  | 326/41  |
| 7,394,708 | B1 * | 7/2008 | Vadi  | 365/201 |

OTHER PUBLICATIONS

"About HardCopy ASIC Series," http://www.altera.com/products/devices/hardcopy-asics/about/hrd-index.html, Altera, downloaded Jan. 22, 2009, 1 page.

* cited by examiner

*Primary Examiner* — Howard Weiss
*Assistant Examiner* — Steven Rao
(74) *Attorney, Agent, or Firm* — Slater & Matsil, L.L.P.

(57) ABSTRACT

A method of designing integrated circuits includes providing a first chip and a second chip identical to each other. Each of the first chip and the second chip includes a base layer including a Logic Transistor Unit (LTU) array. The LTU array includes LTUs identical to each other and arranged in rows and columns. The method further includes connecting the base layer of the first chip to form a first application chip; and connecting the base layer of the second chip to form a second application chip different from the first application chip.

20 Claims, 10 Drawing Sheets

METHODS FOR FORMING PROGRAMMABLE TRANSISTOR ARRAY COMPRISING BASIC TRANSISTOR UNITS

This application claims priority to U.S. Provisional Patent Application Ser. No. 61/146,564, filed Jan. 22, 2009, and entitled, "Programmable Transistor Array Design Methodology," which application is hereby incorporated herein by reference.

TECHNICAL FIELD

This invention relates generally to integrated circuits and more particularly to the design methodology of integrated circuits.

BACKGROUND

The design of integrated circuits typically includes several phases. Before mass production of the integrated circuits, prototypes are typically made to verify the design of the integrated circuits. Field programmable gate array (FPGA) and cell based design (CBD) are among the most commonly used design methods.

FIG. 1 illustrates a FPGA design, which includes a plurality logic units placed in an array, with predefined interconnects (not shown) built in. The FPGA may be programmed through an anti-fuse switch box (not shown), so that chips having a same FPGA design may be used to implement different circuits having different functions. Additional functional modules, such as embedded memories and processors, may be built in the FPGA chips. Since one FPGA design may be shared by multiple applications, the design cost is also shared by the multiple applications, and hence is relatively low. Further, the design cycle is short due to the fact that existing FPGA design may be used without the need to start from scratch. However, limited by the low performance of the resulting circuits, FPGA is only suitable for low-volume production with high unit cost, and is often used only in prototype design.

CBD methodology, on the other hand, is generally used for application specific integrated circuit (ASIC) design, as shown in FIG. 2. CBD design may adopt standard cells to implement the integrated circuits and the standard cells are typically arranged into rows. However, the placement of the standard cells is customized from application to application, and a row may include different standard cells. The logic functions are implemented through interconnected standard cells. Accordingly, the interconnection, as a result of the randomly placed standard cells, is also not fixed. Custom macros, such as embedded memories and analog macros, can be included in the CBD and randomly placed within the respective chips. Due to the customized design, the circuits designed adopting the CBD methodology typically enjoy high performance.

The CBD methodology also suffers from drawbacks. When the integrated circuits are formed using 45 nm technology and below, all CBD design based on conventional design rules starts to suffer from serious process variations, which may be as great as about 30 percent. This causes significant reduction in the performance yield. On the other hand, since all of the base layer (the layer including active regions and gate electrodes) and metal layers are customized, the cost of the design using the CBD methodology is also high. For example, the design may cost about half a million dollars or more. The cycle time is also long, with typically more than 12 weeks required if advanced nano-technologies are to be adopted.

Accordingly, what is needed in the art is a design methodology that may combine the advantageous features of the flexibility and low cost of FPGA, and the high performance of CBD.

SUMMARY OF THE INVENTION

In accordance with one aspect of the present invention, a method of designing integrated circuits includes providing a first chip and a second chip identical to each other. Each of the first chip and the second chip includes a base layer including a Basic Transistor Unit (BTU) and Logic Transistor Unit (LTU) array.

The BTU is further divided into PMOS Transistor Unit (PTU), NMOS Transistor Unit (NTU) and Dummy Transistor Unit (DTU). Both PTU and NTU are defined with regular layout architecture, with an even number of polys being placed on an active region, and two dummy polys adjacent the active region and in the field oxide area. The polys can be accessed from either side of the active region. Moreover, PTU and NTU can be grouped individually or combined together to create CMOS logic.

The LTU array includes LTUs identical to each other and arranged in rows and columns. The method further includes connecting the base layer of the first chip to form a first application chip; and connecting the base layer of the second chip to form a second application chip different from the first application chip.

In accordance with another aspect of the present invention, a method of designing integrated circuits includes providing a base layer design of chips. The base layer design includes designs of LTUs formed of a basic transistor unit array. The LTUs include a plurality of identical LTUs, with each of the LTUs including two inverters; two multiplexers; and two gates selected from the group consisting essentially of two NAND gates and two NOR gates. The method further includes using the base layer design to form a first base layer of a first chip; using the base layer design to form a second base layer of a second chip; and forming a bottom metal layer (first M1) over the first base layer of the first chip. The first M1 connects the LTUs of the first chip into a plurality of combinations of logic gates. The method further includes forming a second metal layer (first M2) over the first M1, wherein the first M2 modifies the LTUs of the first chip into a plurality of logical functional units; and forming a third metal layer (first M3) over the first M2. The method further includes forming an additional bottom metal layer (second M1) over the second base layer of the second chip. The second M1 connects the LTUs of the second chip into a plurality of combinations of additional logic gates. The method further includes forming an additional second metal layer (second M2) over the second M1, wherein the second M2 modifies the LTUs of the second chip into a plurality of additional logical functional units; and forming an additional third metal layer (second M3) over the second M2, wherein the second M3 is different from the first M3.

In accordance with yet another aspect of the present invention, an integrated circuit structure includes a first chip and a second chip. The first chip includes a first base layer including a first LTU array, wherein the first LTU array includes first LTUs identical to each other and arranged in rows and columns. The second chip includes a second base layer including a second LTU array, wherein the second LTU array includes second LTUs identical to each other and arranged in rows and columns. The first base layer is identical to the second base layer. The integrated circuit structure further includes a first metal layer (first M1) over the first base layer; a second metal layer (first M2) over the first M1; a third metal layer (first M3) over the first M2; an additional first metal layer (second M1) over the second base layer; an additional second metal layer (second M2) over the second M1; and an additional third metal layer (second M3) over the second M2, wherein the first M3 has a different layout than the second M3.

In accordance with yet another aspect of the present invention, an integrated circuit structure includes a first chip including a first base layer, and a second chip including a second base layer identical to the first layer. Each of the first base layer and the second base layer includes LTUs identical to each other. The LTUs are formed of BTU arrays. Each of the LTUs includes two inverters; two multiplexers; and two gates selected from the group consisting essentially of two NAND gates and two NOR gates. The first chip further includes a first metal layer (first M1) over the first base layer, wherein the first M1 connects the LTUs of the first chip into a first combination of logic gates; a second metal layer (first M2) over the first M1, wherein the first M2 modifies the LTUs of the first chip into a first plurality of logical functional units; and a third metal layer (M3) over the first M2. The second chip further includes an additional first metal layer (second M1) over the second base layer, wherein the second M1 connects the LTUs of the second chip into a second combination of logic gates; an additional second metal layer (second M2) over the second M1, wherein the second M2 modifies the LTUs of the second chip into a second plurality of logical functional units; and an additional third metal layer (second M3) over the second M2, wherein the second M3 has a layout different from the first M3.

The advantageous features of the present invention include reduced cost and reduced cycle time as a result of a fixed base layer design, and the improved flexibility as a result of customized metal layers.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

A novel method for developing integrated circuits is provided. Throughout the description, the term "Programmable Transistor Array" (PTA) is used to refer to array of Logic Transistor Units (LTUs) and/or arrays of Basic Transistor Units (BTUs), which may be interconnected (programmed) differently for different applications. The respective design methodology is referred to as a PTA methodology and the semiconductor chips manufactured using the PTA methodology (and hence including the LTUs) are accordingly referred to as PTA chips.

Figure 1:
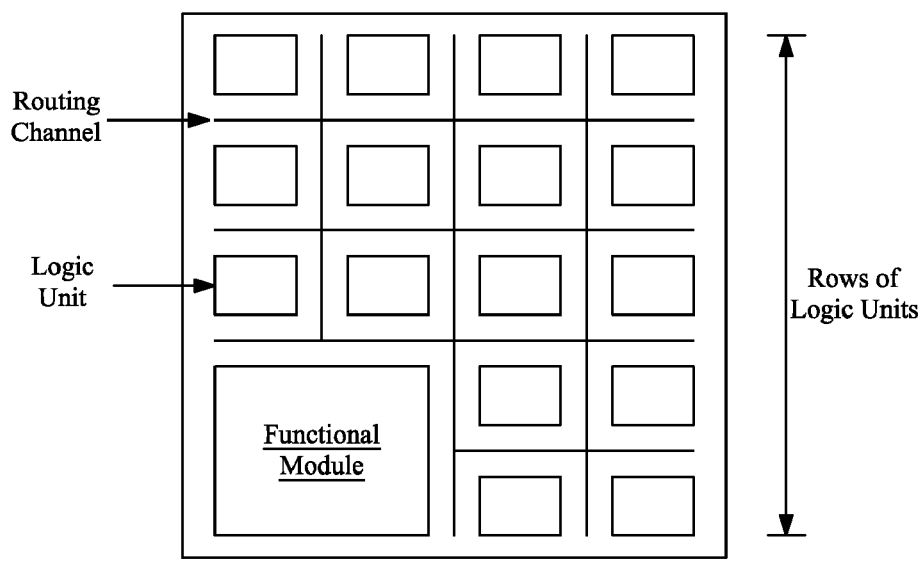
FIG. 1 illustrates a conventional field programmable gate array (FPGA) design.
Figure 2:
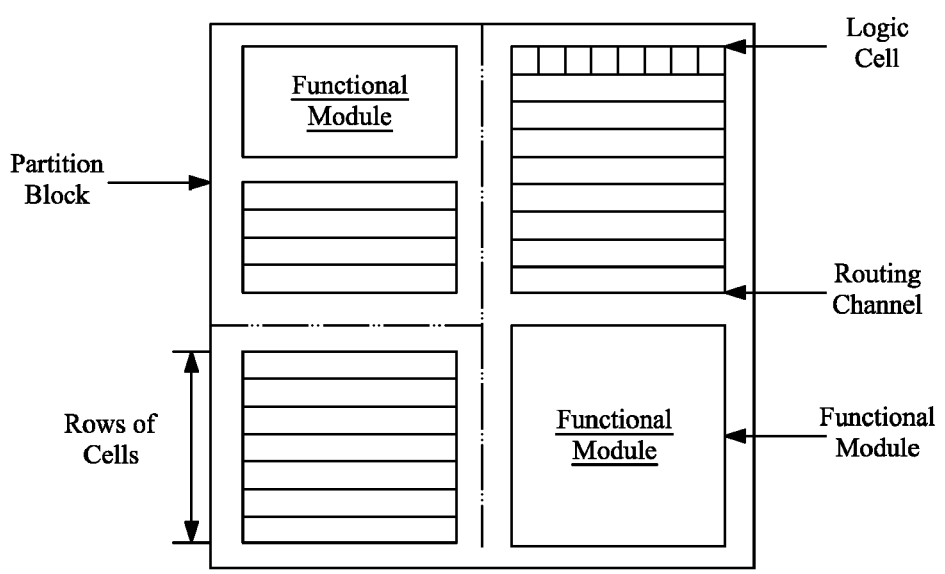
FIG. 2 illustrates a conventional cell based design (CBO)
Figure 3C:
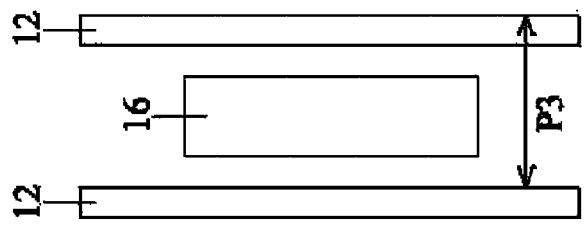
FIGS. 3A, 3B, and 3C show layouts of a basic PMOS Transistor Unit (PTU), a basic NMOS Transistor Unit (NTU), and a Dummy Transistor Unit (DTU), respectively.
Figure 3B:
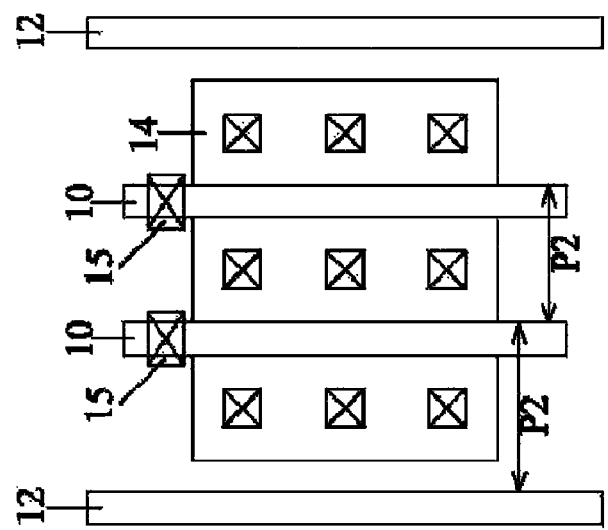
Figure 3A:
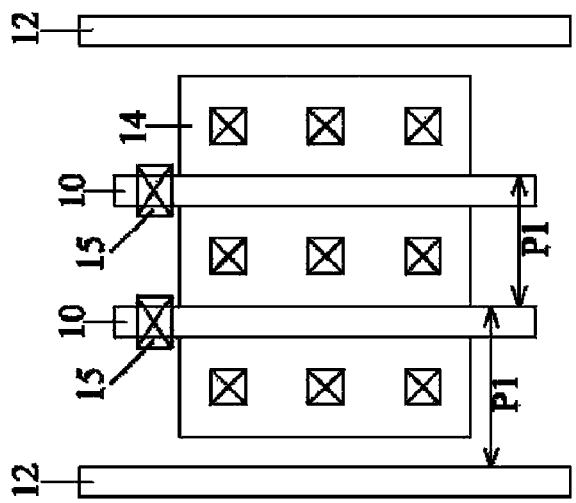
Figure 6A:
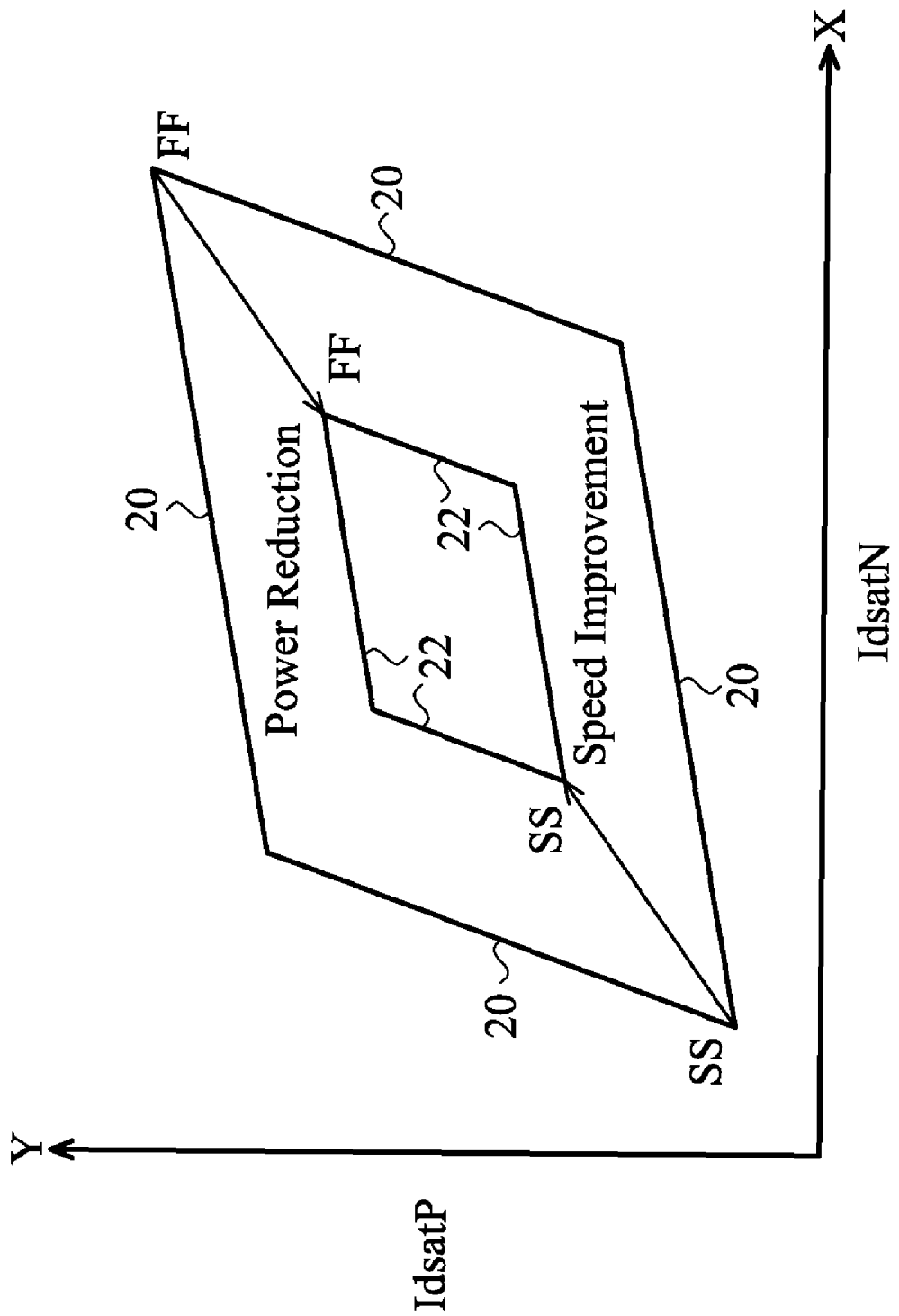
FIG. 6A illustrates process corners of restricted design rules compared to the process corners of convention design rules.
Figure 6B:
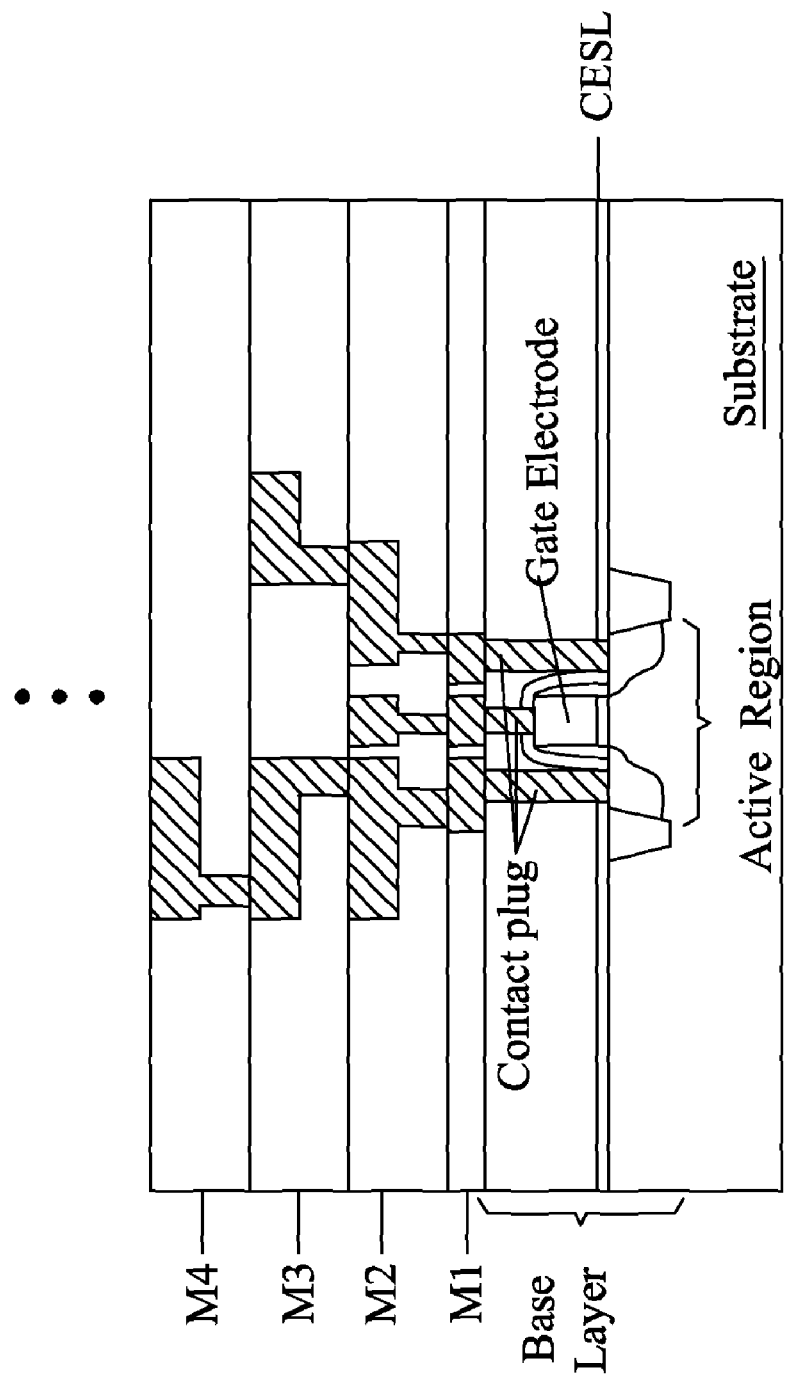
FIG. 6B illustrates an exemplary cross-sectional view of a base layer and the overlying metal layers.

Each of the PTA chips includes a base layer and metal layers for the interconnection of the base layer (refer to FIG. 6B). The base layer includes BTUs, which include PMOS Transistor Units (PTUs), NMOS Transistor Units (NTUs), and Dummy Transistor Units (DTUs). FIGS. 3A, 3B, and 3C illustrate exemplary layouts of a PTU, an NTU, and a DTU, respectively. Preferably, in the design of PTAs, restrict design rules (RDR) are applied for the implementation (including the placement and the layout) of the BTUs, wherein the RDR is stricter than conventional design rules. The RDR is targeted to minimize the process variation in the geometry of small devices. The enforcement of the RDRs ensures the tightening of process corners of the integrated circuits (as will be discussed in detail in subsequent paragraphs), and the reduction in process variations.

In an exemplary embodiment, the PTU as shown in FIG. 3A and the NTU as shown in FIG. 3B have two (or other even numbers such as 4, 6, and the like) gate polys 10 and two dummy polys 12 parallel to each other, wherein dummy polys 12 are beside active region 14 and directly over the insulation region (a shallow trench isolation region or a field oxide). It is noted that although the term "poly" is used, the gate electrodes of PTUs and NTUs may be formed of other conductive materials such as metals, metal silicides, and the like. All poly pitches P1 of all PTUs are preferably equal to each other. All poly pitches P2 of all NTUs are preferably equal to each other. All pitches P3 of all DTUs are preferably equal to each other. Further, pitches P1, P2, and P3 are preferably equal to each other. Only rectangular active regions are allowed, and the N-wells (in which PTUs are located, not shown) need to be great enough. PTUs and NTUs may be covered with a blanket tensile stressed contact etch stop layer (CESL). In which case, each of the PTUs may be covered by an additional compressive CESL, with the compressive CESL having a smaller enclosure in the channel-width direction of the PTU, and a greater enclosure in the channel-length of the PTU. More than one contact plug needs to be placed to access gate polys to improve device connectivity. On the other hand, NTUs are formed in p-type substrates directly, without being formed in any p-well. No additional CESL is needed for the NTUs. The polys can be accessed through contact plugs 15 from either sides of the respective active region 14. Contact plugs 15, however, will not be directly over the respective active region 14. Moreover, PTU and NTU can be grouped individually or combined together to create CMOS logic.

Please note that the PTUs, NTUs, and DTUs are fundamental building blocks of the embodiments of the present invention. In a semiconductor chip, substantially all (for example, more than 90 percent, or even more than 95 percent, or even 100 percent) PMOS devices may have the specification as the PTU described in the preceding paragraphs. Further, in the semiconductor chip, substantially all of PMOS devices use an identical PTU layout. In the semiconductor chip, substantially all (for example, more than 90 percent, or even more than 95 percent, or even 100 percent) of NMOS devices use an identical NTU layout, and substantially all (for example, more than 90 percent, or even more than 95 percent, or even 100 percent) of dummy cells use an identical DTU layout, although more than one layout for each of the PTU, NTU, and DTU can be used.

Figure 4A:
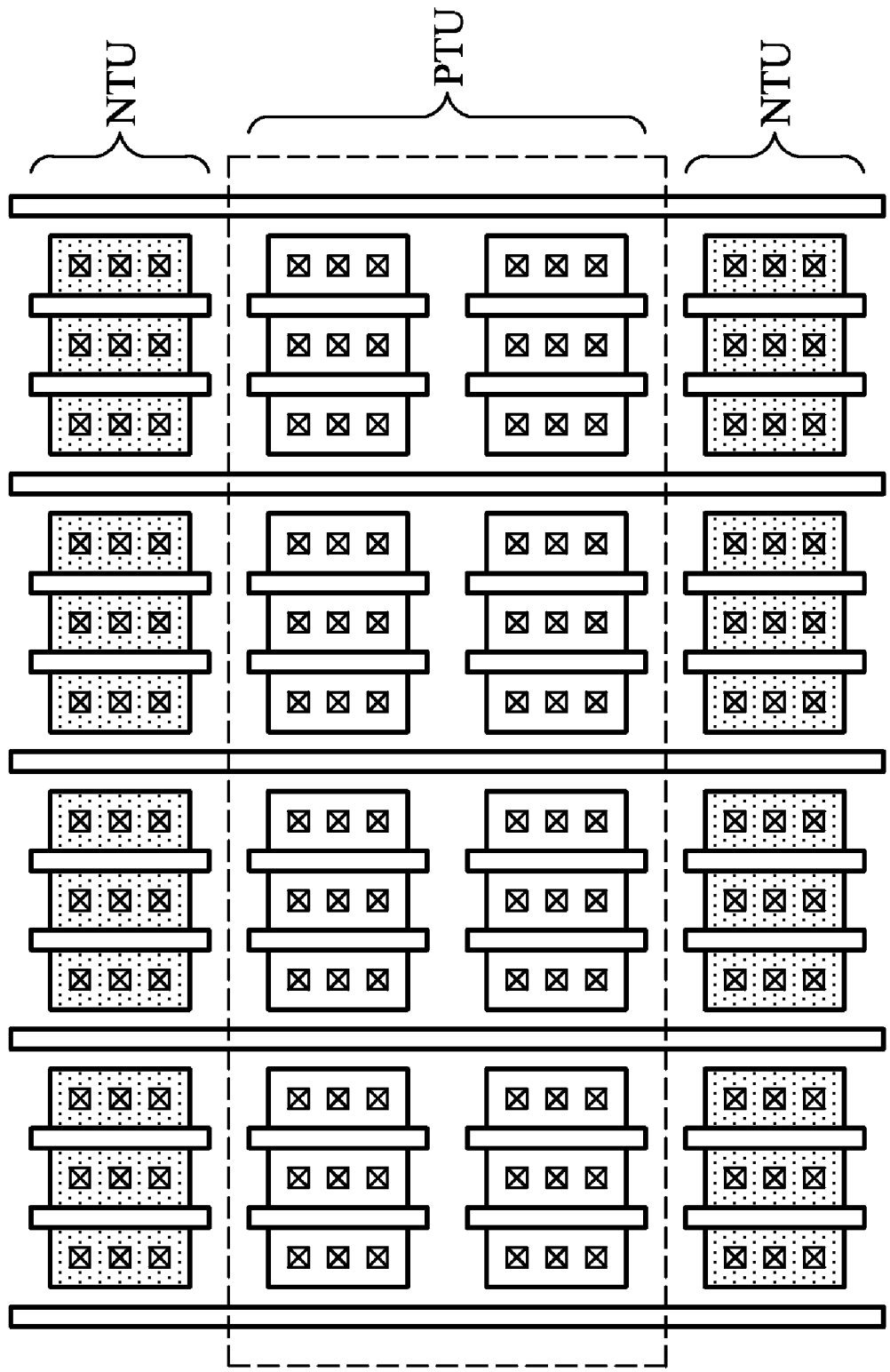
FIGS. 4A and 4B illustrate exemplary basic transistor unit (BTU) arrays.
Figure 4B:
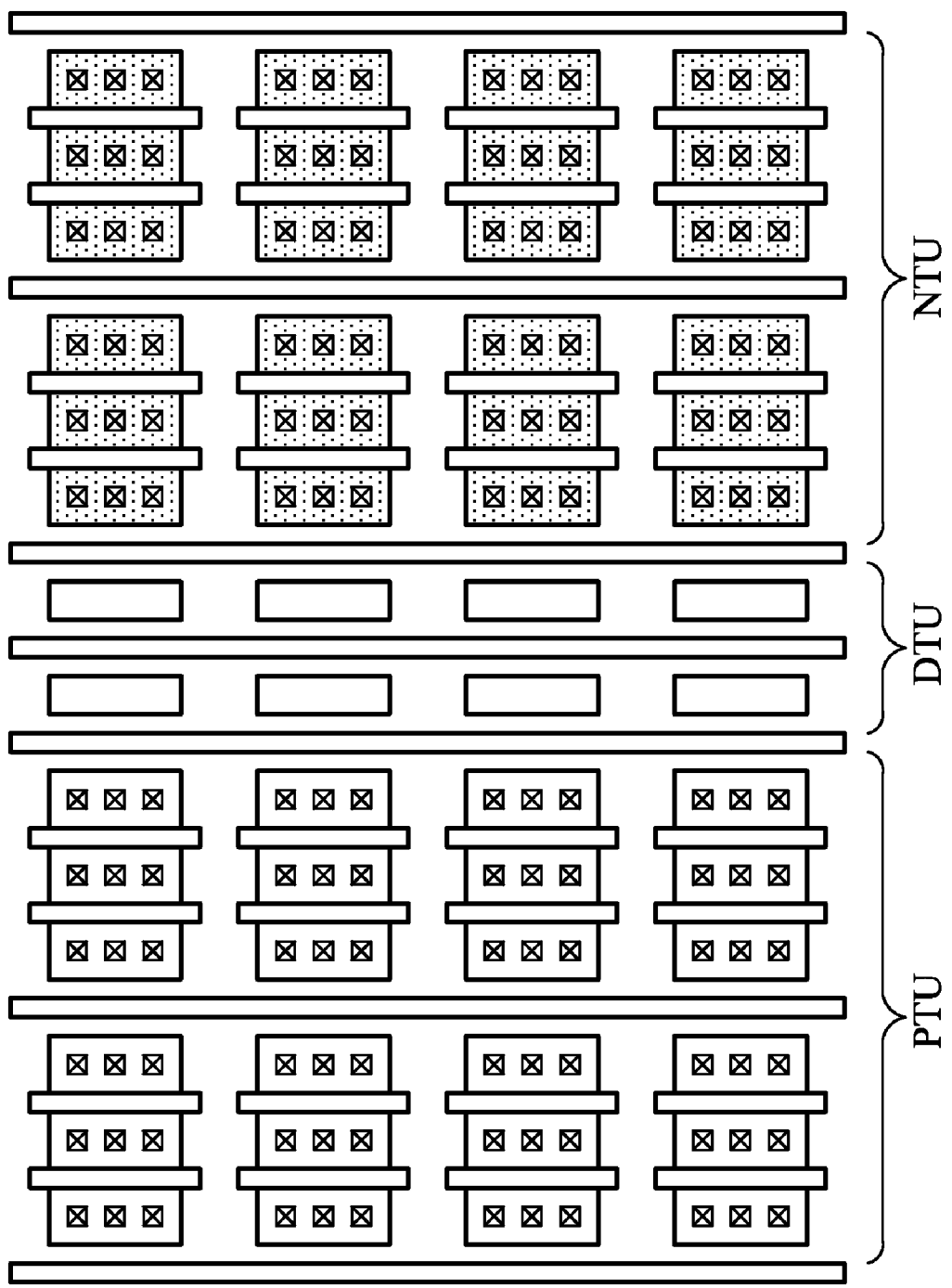

Besides the above-discussed exemplary layout restrictions, FIGS. 4A and 4B illustrate two acceptable schemes for placing the BTUs. For example, in FIG. 4A, the NTUs may be placed to the top or the bottom of PTUs. FIG. 4B illustrates that no PTU can be placed immediately to the left or right of an NTU (when their channel-length directions are aligned to a same line), unless a DTU separates the PTU and the NTU. The rules for acceptable and unacceptable ways of placing the BTUs are listed in Table 1. PTU and NTU can be placed separately to form PMOS and NMOS logic gates which are often used by custom circuit design. Moreover, PTU and NTU can be grouped together to form a CMOS logic. However, placement restriction may be required.

TABLE 1

| | PTU (1) | | | NTU (1) | | |
|---|---|---|---|---|---|---|
| | PTU (2) | NTU (2) | DTU (2) | PTU (2) | NTU (2) | DTU (2) |
| Top | Yes | Yes | Yes | Yes | Yes | Yes |
| Bottom | Yes | Yes | Yes | Yes | Yes | Yes |
| Left | Yes | No | Yes | No | Yes | Yes |
| Right | Yes | No | Yes | No | Yes | Yes |

PTUs, NTUs, and DTUs are marked with (1) or (2). Table 1 indicates the rules regarding whether a PTU or an NTU marked as (1) can be placed immediately to the top, the bottom, the left, or the right of a BTU marked as (2). Therefore, Table 1 indicates that no PTU can be placed immediately to the left or right of another NTU, while all other placement schemes are allowable.

Figure 5A:
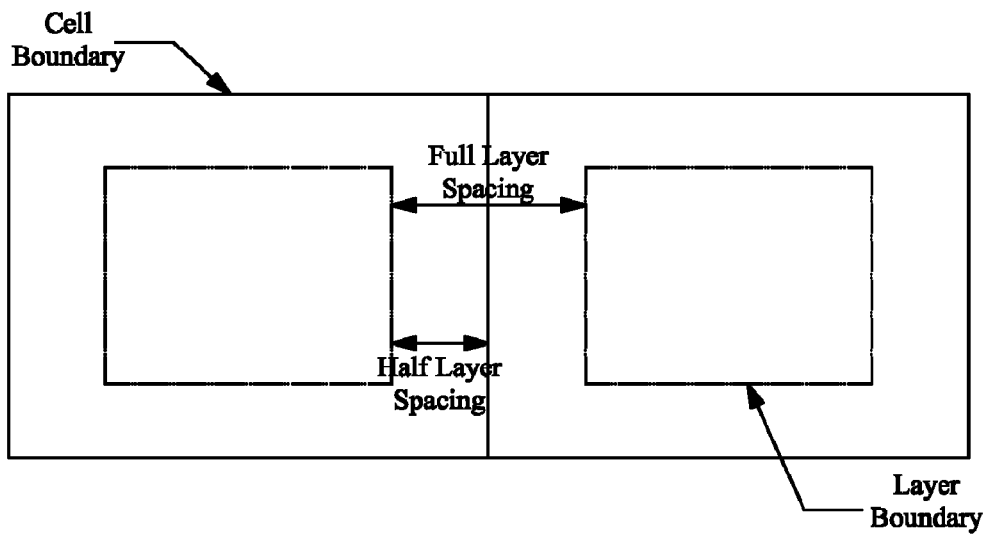
FIG. 5A illustrates a conventional scheme showing the allowable boundary of the metal lines for the internal connection of a standard cell, wherein the conventional scheme is in a conventional design adopting conventional design rules.
Figure 5B:
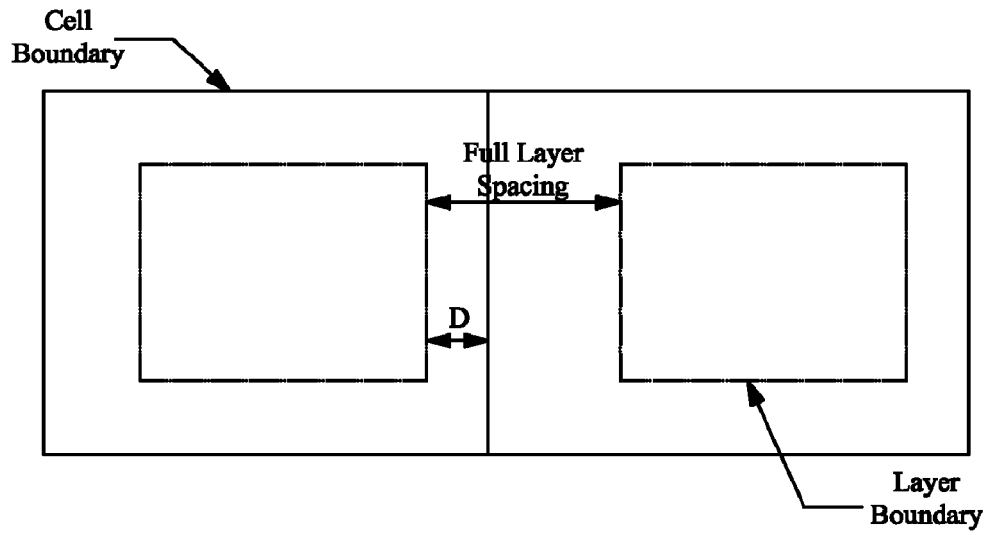
FIG. 5B illustrates a scheme showing the allowable boundary of the internal metal lines for the internal connection of a standard cell adopting restricted design rules.

The implementation of the BTUs brings in several advantageous features. First, since the layout topology is optimized at transistor (BTU) level, the optimization is generic and is not tied to specific applications. The physical layout impact is thus minimized. Second, the additional metal layer routing requirement and the resulting area penalty as shown in FIG. 5A is eliminated, and the relaxed metal layer routing requirement as shown in FIG. 5B can be adopted. Third, the PTU, NTU and DTU in PTA structures can be modified to fit to any digital/analog configurations, while as a comparison, conventional field programmable gate array (FPGA) and gate array (GA) can only be used for digital configurations.

The process corners are tightened for speed improvement and power reduction, as shown schematically in FIG. 6A. The X-axis indicates saturation current Idsat (shown as IdsatN) for NMOS transistors, and the Y-axis indicates saturation current Idsat (shown as IdsatP) for PMOS transistors. The diamond region encircled by lines 20 represents conventional operation regions of MOS devices implemented using conventional design rules, while the diamond region encircled by lines 22 represents the tightened operation regions of BTUs implemented using the RDRs. The left bottom corner represents slow MOS transistors consuming less power, marked as SS, with the right top corner represents fast MOS transistors consuming more power, marked as FF. It is noted that the tightened operation region has improved speed and reduced power consumption, with the respective BTUs operated in a region representing much smaller process variations. Experimental results have shown that compared to conventional design rules, the RDR has resulted in a speed corner reduction of about 3 percent. The leakage currents of transistors are also reduced from about 47 nA to about 29 nA. The power consumption of transistors is reduced from about 86 µwatts to about 83 µwatts.

Referring to FIG. 6B, the BTUs are implemented in the base layer of semiconductor chips. The base layer includes at least a portion of the semiconductor substrate including well regions (not shown), active regions of BTUs, the gate poly level including gate electrode strips, and contact etch stop layers (CESLs). Higher levels of functions of the integrated circuit are implemented through the connections in metal layers, such as metal layer 1 (M1), which is the metal layer immediately over contact plugs, metal layer 2 (M2), metal layer 3 (M3), metal layer 4 (M4), and the like. Metal layers M1 and up are not in the base layer.

In the PTA design, the design of the base layer is fixed regardless of the applications of the respective chips. Therefore, no modification needs to be made to the masks of the base layer even if the chips are used for different applications. To implement different applications, different masks need to be made to modify the design of metal layers, including M1, M2, and upper metal layers. In other words, the base layer is fixed, and the metal layers act as the program means for making different applications out of the same base layer. Accordingly, semiconductor wafers/chips with the same baser layer design may be made, and the wafers/chips may be made for different applications by changing the design of metal layers M1, M2, and the like. Using this method, more than five applications, ten applications, one hundred applications, one thousand applications different from each other may be made from the same base layer design.

Figure 7:
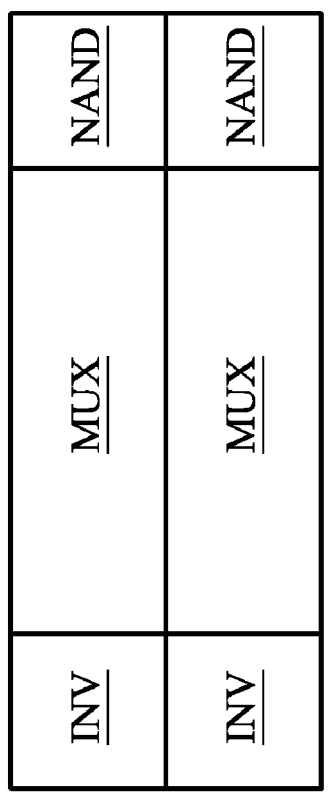
FIG. 7 illustrates a schematic block diagram of an exemplary Logic Transistor Unit (LTU)

Referring to FIG. 7, BTUs, which may be connected to form basic gates such as inverters (INV), NAND gates, and NOR gates, more complex logic (i.e. AND-OR-Invert (AOI) logic, OR-AND-Invert (OAI) logic, adder, or the like) can be implemented using multiple BTUs. Various logic families can be derived from the BTUs using first metal layers. FIG. 7 illustrates an exemplary LTU including two INVs, two multiplexers (MUXs, which are also formed of BTUs), and two NAND gates. The connection of BTUs to form the gates is referred to as LTU functionality placement, and is implemented through metal layer M1, although metal layer M2 may also be used. It is realized that an LTU may include different numbers of INVs, MUXs, and NAND gates than shown in FIG. 7, and may further include other components such as NOR gates. The LTUs may be arranged as an array or plurality of arrays (refer to FIG. 9).

Figure 8:
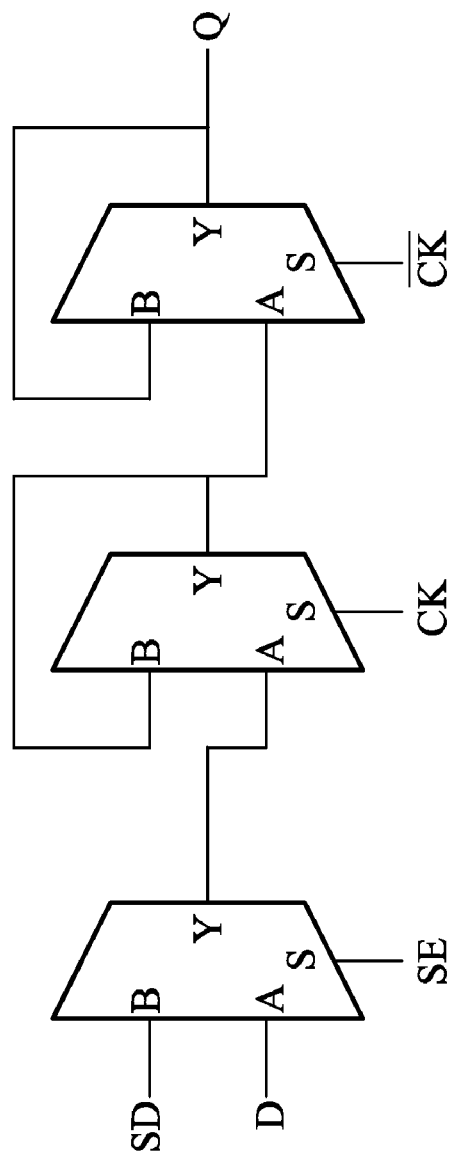
FIG. 8 illustrates a diagram of an exemplary flip-flop formed by reconnecting LTUs.

The logic gates implemented through the LTU functionality placement is further modified (with the help of the MUXs)

into more complex functional units such as XOR, XNOR, adder, latch, flip-flop, and the like. FIG. 8 illustrates an exemplary scan flip-flop formed of two LTUs. Such modification is referred to as LTU functionality routing, and is implemented through metal layer M2 (not shown), although metal layers M3 and M4 may be involved.

PTA may employ new routing methodology called two-level metallization, which can be implemented in two approaches. In a first approach, BTUs can be configured as different logic gates similar to the CBD approach, in which only one metal layer, for example, metal layer M1, is used to connect the BTUs into LTUs, and to connect the LTUs into the complex functional units. In a second approach, which is similar to the FPGA approach, two metal layers are involved. BTUs can be implemented as LTUs using the first metal layer M1, and then derived into more complex functional units using metal layer M2. This two-level metallization methodology is developed to be compatible with current CBD and FPGA approaches.

With the basic gates and the more complex functional units being formed through the low-level metal layers, higher-level functions and the application may be implemented through further metal connections, which may be implemented in any of the metal layers M1 through Mtop, and more preferably through the upper layers such as M3, M4, and higher.

Clearly, if the metal layer M1 and M2 of two chips have different patterns, the layouts of M3 layers and layers above these two chips will also be different. In an embodiment of the present invention, two different applications require two chip designs, wherein the base layers of the two chips (or wafers) designs are identical to each other, and only the metal layers (including the LTU functionality placement and LTU functionality routing) are different. In this case, the applications of the two chips may be completely different from each other, and may even be for different segments, such as the communication segment and consumer product segment. Conversely, two chips may be for two applications similar to each other. Therefore, these two chips may share a common base layer design and common M1 and M2 design, and only metal layer M3 and upper levels of metal layers are different and need to be re-designed. In yet other embodiments, two chips may share a common base layer design and a common M1 design, and only M2 and upper levels of metal layers are different and need to be re-designed. This further reduces the manufacturing cost and cycle time.

Figure 9:
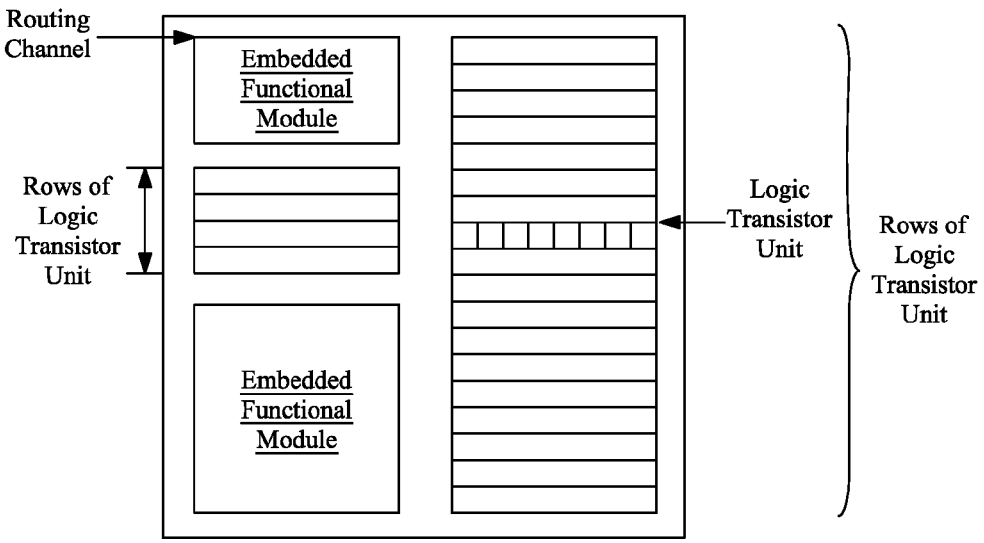
FIG. 9 illustrates a block diagram of a semiconductor chip adopting embodiments of the present invention.

FIG. 9 illustrates a top view of a portion of a semiconductor chip adopting the PTA design. Rows of LTUs (and/or the BTUs in the LTUs) are laid out as one or more array. Additional embedded functional modules such as memories and processors may also be built in the chip. Additional routing channels may be formed to improve the routability, wherein a routing channel is used to connect one point to a remote point. It is noted that the customized connections are made through metal routing rather than an anti-fuse box (as in FPGA), therefore, the chip may not include an anti-fuse box.

Figure 10:
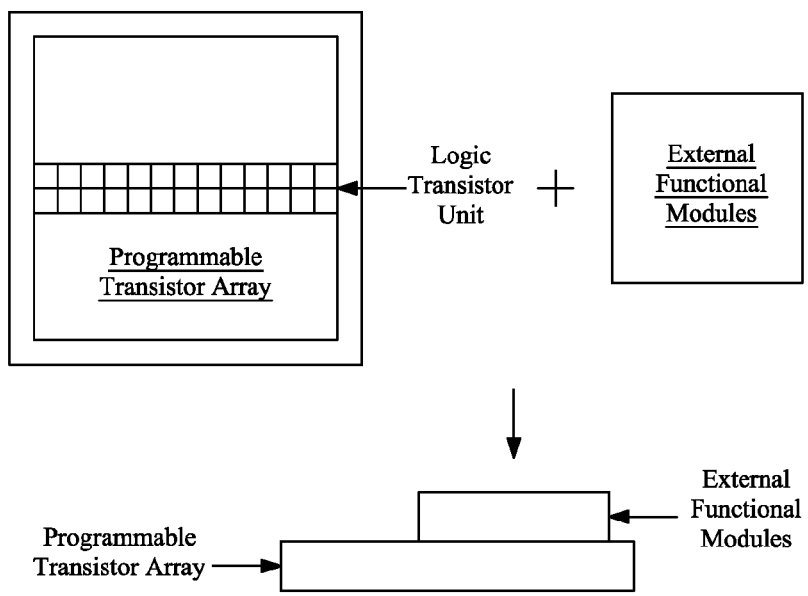
FIG. 10 illustrates a chip including a Programmable Transistor Array (PTA), stacked with an external functional module.

Referring to FIG. 10, an advantageous feature of the present invention is that the metal layers are customized, accordingly, external functional modules may be connected to the PTA chips through flip-chip bonding or Through Silicon Via (TSVs). The bond pads of the PTA chips may be designed to fit the bond pads or TSVs of the external chips. The ability for attaching external functional modules further improves the yield and reduces the production cost. Therefore, from a same base layer design, a first PTA chip may be made and attached with a first external functional module, while a second PTA chip may be made and attached with a second external functional module different from the first external functional module, although the first PTA chip and the second PTA chip share a same base layer design. Alternatively, the second PTA chip may not be attached with any external functional module.

Figure 11:
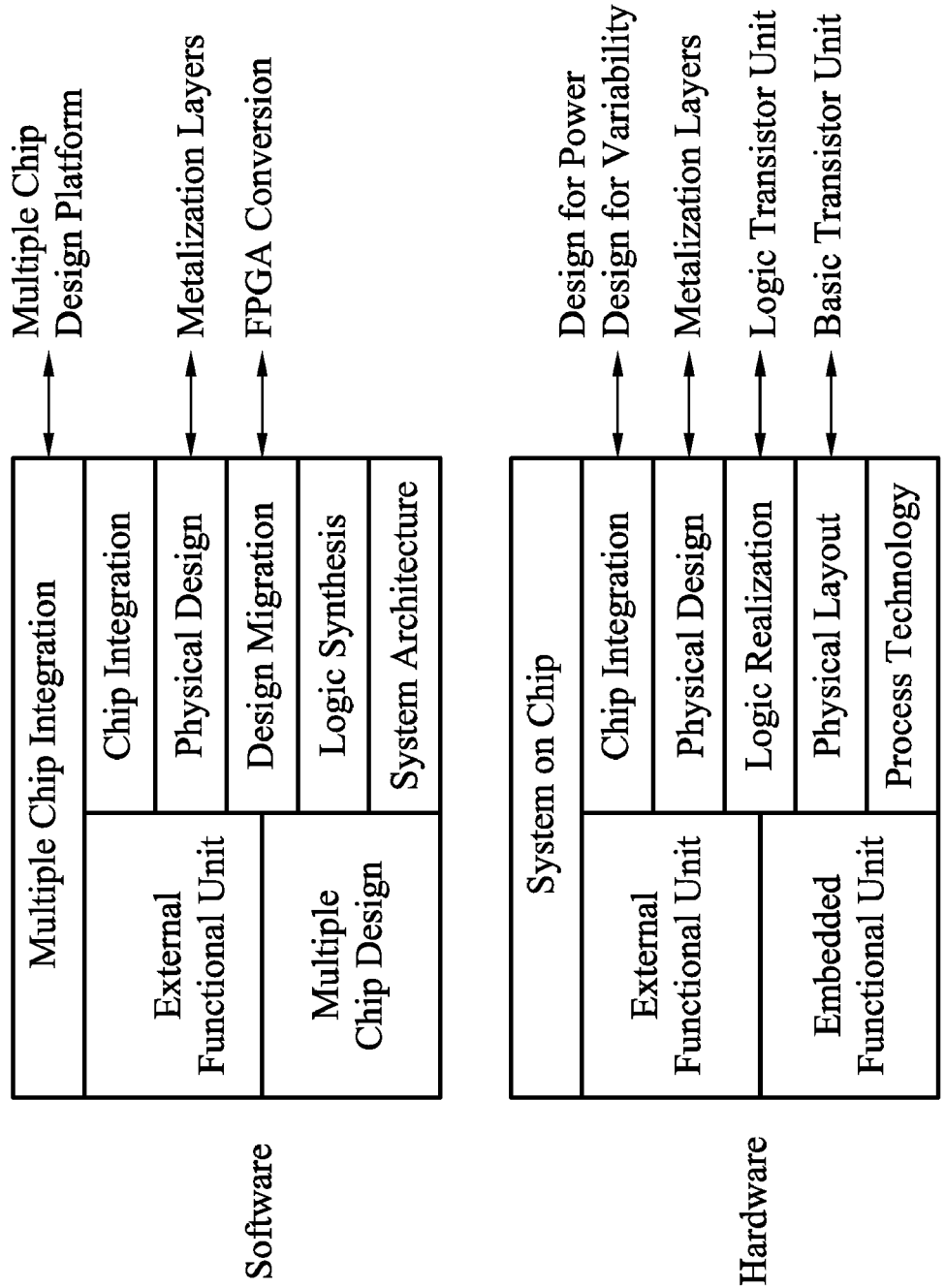
FIG. 11 illustrates the hardware and software components related to the PTA design.

FIG. 11 illustrates the hardware and software components related to the PTA design. The hardware components, which were discussed in the preceding paragraphs, include the physical layout of the BTUs, the BTU array, and the embedded functional modules. The higher level of the hardware includes the layout of LTUs. The LTUs are interconnected through two levels of metallization M1 and M2, and upper layers. For the whole-chip integration, design for power (DFP) and design for variability (DFV) techniques may be used for reducing power and reducing variation. Again, the hardware components include embedded functional units and external functional units (modules).

The software components of the PTA design include design migration for migrating CBD designs and/or FPGA designs to PTA designs, for example, through netlist translation. This means that the conventional FPGA designs and CBD designs can be easily implemented using PTA designs. Accordingly, software may be designed to support the mapping and the migration from CBD designs and FPGA designs to PTA designs. The two-level metallization routing may also be implemented through the help of software, and the migration from FPGA designs or CBD designs may be automated, including, but not limited to, the automation of laying out metal layers M1 and M2 according to the migrated PTA designs. Further, for attaching external functional units, software may be provided, which considers the PTA chip and the external functional unit as an integrated platform so that designers do not have to consider the PTA and the external functional unit separately. The software may further take the design of multiple chips into a common platform.

The PTA design has several advantageous features. Due to the predefined BTU architecture, designers do not need to re-design the base layer. Instead, only the metal layers need to be redesigned. This significantly reduces the cost and production cycle. The production cycle time may be reduced to less than one quarter of the CBD design. The mask cost may be reduced to less than ten percent of the CBD design. Therefore, small companies that otherwise would not be able to afford the high cost can also utilize advanced nano-technology for volume production.

Further, the PTA design has the advantageous features of high flexibility. It may include embedded modules only, mix-modules including embedded modules and stacked modules (connected through TSVs), or off-chip modules bonded to the PTA chips. Also, the high flexibility, which is related to the random placement of metal layers, is combined with the predefined base layer so that the low production cost and low cycle time are not sacrificed.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of designing integrated circuits, the method comprising:
providing a first chip and a second chip identical to each other, wherein each of the first chip and the second chip comprises a base layer comprising a Logic Transistor Unit (LTU) array, and wherein the LTU array comprises LTUs identical to each other and arranged in rows and columns;
connecting the base layer of the first chip to form a first application chip; and
connecting the base layer of the second chip to form a second application chip different from the first application chip, wherein metal lines for connecting the base layer of the first chip and metal lines for connecting the base layer of the second chip have different layouts.

2. The method of claim 1, wherein each of the LTUs comprises a multiplexer.

3. The method of claim 2, wherein each of the LTUs further comprises an inverter and a gate selected from a NAND gate and a NOR gate.

4. The method of claim 1, wherein the step of connecting the base layer of the first chip comprises using metal layer one (M1) to modify different LTUs in the LTU array of the first chip into different logic gate combinations.

5. The method of claim 4, wherein the step of connecting the base layer of the first chip further comprises using metal layer 2 (M2) to modify different LTUs in the LTU array of the first chip into different logic functional units.

6. The method of claim 5, wherein the different logic functional units are selected from the group consisting essentially of XOR gates, XNOR gates, adders, latches, and flip-flops.

7. The method of claim 1 further comprising attaching a first external functional module to the first chip.

8. The method of claim 7 further comprising attaching a second external functional module to the second chip, wherein the second external functional module is different from the first external functional module.

9. The method of claim 1, wherein all PMOS transistors in the LTUs have an identical layout, and all NMOS transistors in the LTUs have an additional identical layout.

10. The method of claim 1, wherein each of the LTUs in the first chip and the second chip comprises a plurality of basic PMOS Transistor Units (PTUs) and a plurality of basic NMOS Transistor Units (NTUs), and no PTU in any of the LTUs is located adjoining an NTU with a channel-length direction of the PTU aligned to a channel-length direction of the NTU.

11. The method of claim 1, wherein each of the LTUs in the first chip and the second chip comprises an array of Basic Transistor Units (BTUs) selected from the group consisting essentially of NMOS Transistor Units (NTUs), PMOS Transistor Units (PTUs), and Dummy Transistor Units (DTUs).

12. A method of designing integrated circuits, the method comprising:
providing a base layer design of chips, wherein the base layer design comprises designs of Logic Transistor Units (LTUs) formed of a Basic Transistor Unit (BTU) array, wherein the LTUs comprise a plurality of identical LTUs, and wherein each of the LTUs comprises:
two inverters;
two multiplexers; and
two gates selected from the group consisting essentially of two NAND gates and two NOR gates;
using the base layer design to form a first base layer of a first chip;
using the base layer design to form a second base layer of a second chip;
forming a bottom metal layer (first M1) over the first base layer of the first chip, wherein the first M1 connects the LTUs of the first chip into a plurality of combinations of logic gates;
forming a second metal layer (first M2) over the first M1, wherein the first M2 modifies the LTUs of the first chip into a plurality of logical functional units;
forming a third metal layer (first M3) over the first M2;
forming an additional bottom metal layer (second M1) over the second base layer of the second chip, wherein the second M1 connects the LTUs of the second chip into a plurality of combinations of additional logic gates;
forming an additional second metal layer (second M2) over the second Ml, wherein the second M2 modifies the LTUs of the second chip into a plurality of additional logical functional units; and
forming an additional third metal layer (second M3) over the second M2, wherein the second M3 is different from the first M3.

13. The method of claim 12, wherein the second M2 is different from the first M2, and the second Ml is different from the first Ml.

14. The method of claim 12, wherein the second M2 is different from the first M2, and the second M1 is identical to the first M1.

15. The method of claim 12, wherein the second M2 is identical to the first M2, and the second M1 is identical to the first Ml.

16. The method of claim 12, wherein the logical functional units are selected from the group consisting essentially of XOR gates, XNOR gates, adders, latches, and flip-flops.

17. The method of claim 12, wherein the base layer design comprises designs of active regions, well regions, gate electrodes.

18. The method of claim 12 further comprising attaching a first external functional module to the first chip.

19. The method of claim 18 further comprising attaching a second external functional module to the second chip, wherein the second external functional module is different from the first external functional module.

20. The method of claim 18, wherein the second chip is not attached with any external functional module.

* * * * *